United States Patent
Park

(10) Patent No.: US 7,151,274 B2
(45) Date of Patent: Dec. 19, 2006

(54) DUAL PANEL TYPE ORGANIC ELECTROLUMINESCENT DEVICE

(75) Inventor: Jae-Yong Park, Annyang-si (KR)

(73) Assignee: LG.Philips LCD Co., Ltd., Seoul (KR)

(*) Notice: Subject to any disclaimer, the term of this patent is extended or adjusted under 35 U.S.C. 154(b) by 184 days.

(21) Appl. No.: 10/876,640

(22) Filed: Jun. 28, 2004

(65) Prior Publication Data

US 2005/0139820 A1    Jun. 30, 2005

(30) Foreign Application Priority Data

Dec. 30, 2003  (KR) .................. 10-2003-0100682

(51) Int. Cl.
*H01L 29/08* (2006.01)
(52) U.S. Cl. .............. 257/40; 257/39; 257/E51.022
(58) Field of Classification Search .............. 257/40, 257/72, 39
See application file for complete search history.

(56) References Cited

U.S. PATENT DOCUMENTS

| | | |
|---|---|---|
| 5,276,380 A | 1/1994 | Tang |
| 5,294,869 A | 3/1994 | Tang et al. |
| 5,294,870 A | 3/1994 | Tang et al. |
| 5,701,055 A | 12/1997 | Nagayama et al. |
| 5,742,129 A | 4/1998 | Nagayama et al. |
| 5,952,037 A | 9/1999 | Nagayama et al. |
| 6,046,547 A | 4/2000 | Nishio et al. |
| 6,175,345 B1 | 1/2001 | Kuribayashi et al. |
| 6,373,455 B1 | 4/2002 | Kuribayashi et al. |
| 6,548,961 B1 | 4/2003 | Barth et al. |
| 2002/0158577 A1 | 10/2002 | Shimoda et al. |
| 2003/0085401 A1* | 5/2003 | Joo et al. ............... 257/59 |

FOREIGN PATENT DOCUMENTS

| | | |
|---|---|---|
| JP | 2001-117509 | 4/2001 |
| KR | 2000-0076528 | 12/2000 |
| KR | 2003-0014283 | 3/2003 |
| WO | WO 01/62051 A1 | 8/2001 |
| WO | WO 02/078101 A1 | 10/2002 |

* cited by examiner

*Primary Examiner*—Douglas W. Owens
*Assistant Examiner*—Thinh T Nguyen
(74) *Attorney, Agent, or Firm*—McKenna Long & Aldridge LLP

(57) ABSTRACT

An organic electroluminescent device includes first and second substrates facing each other and spaced apart from each other, each of the first and second substrates having a first region and a second region in a periphery of the first region; an array element on an inner surface of the first substrate, the array element having a thin film transistor; an organic electroluminescent diode on an inner surface of the second substrate in the first region; a connection electrode between the first and second substrates in the first region, the connection electrode connecting the first and second substrates electrically; a spacer on an inner surface of the first substrate in the second region, the spacer having a thickness corresponding to a height of the connection electrode; an absorbent layer on an inner surface of the second substrate in the second region; and a seal pattern attaching the first and second substrates, the seal pattern outside of the absorbent layer, wherein first laminate layers including the organic electroluminescent diode of the second substrate in the first region have a thickness substantially equal to a thickness of second laminate layers including the absorbent layer of the second substrate in the second region.

28 Claims, 7 Drawing Sheets emission direction

DUAL PANEL TYPE ORGANIC ELECTROLUMINESCENT DEVICE

The present invention claims the benefit of the Korean Patent Application No. 2003-100682 filed in Korea on Dec. 30, 2003, which is hereby incorporated by reference.

BACKGROUND OF THE INVENTION

1. Field of the Invention

The present invention relates to an organic electroluminescent device, more particularly, to a dual panel type organic electroluminescent device and a method of fabrication thereof.

2. Discussion of the Related Art

Among flat panel displays (FPDs), organic electroluminescent devices (ELD) have been of particular interest in research and development because they are light-emitting type displays that feature wide viewing angle and desirable contrast ratio, as compared with liquid crystal display (LCD) devices. Because such organic ELDs do not require a backlight, they are small and lightweight, as compared to other types of display devices. The organic ELDs have other desirable characteristics, such as low power consumption, superior brightness and fast response time. When driving the organic ELDs, only a low direct current (DC) voltage is required. Moreover, a fast response speed can be obtained. It is understood in the industry that because the organic ELDs are entirely formed with solid materials, which is different from LCD devices, they are sufficiently strong to withstand external impacts and also have a wider operational temperature range. Moreover, because fabricating organic ELDs is a relatively simple process with a few processing steps, it is much cheaper to produce organic ELDs than LCD devices or plasma display panels (PDPs). In particular, manufacturing the organic ELDs only requires deposition and encapsulation apparatuses.

An active matrix organic ELD has a storage capacitor in each pixel to maintain a voltage that is applied to the pixel until the next frame, regardless of the number of the scanning lines. Because a uniform brightness is obtained throughout the pixels with a low applied current due to the storage capacitor, an active matrix organic ELD of low power consumption, high resolution and large area can be manufactured.

FIG. 1 is a schematic cross-sectional view of an organic ELD according to a related art. Referring to FIG. 1, first and second substrates 10 and 20 face each other and are spaced apart from each other. An array element layer "AL" is formed on the first substrate 10, and includes a plurality of thin film transistors (TFTs) "T." Although not shown in FIG. 1, the array element layer "AL" further includes a plurality of gate lines and a plurality of data lines crossing the plurality of the gate lines. A pixel region "P" is defined at a crossing of the gate and date lines. The TFTs "T" are located in the pixel region "P." In addition, a plurality of first electrodes 22, an organic electroluminescent (EL) layer 24 and a second electrode layer 26 are sequentially formed on the array element layer "AL." The first electrodes 22 are connected to the TFTs "T." The first electrode 22, the organic electroluminescent (EL) layer 24 and the second electrode layer 26 constitute an organic EL diode "$D_{EL}$" in the pixel region "P."

Meanwhile, the second substrate 20 is an encapsulating panel having a receded portion "RP." The receded portion "RP" has an absorbent 28 in order to protect the organic ELD from moisture. A seal pattern 29 is formed between the first and second substrates 10 and 20, specifically, at an outermost edge thereof. With the seal pattern 29, the first and second substrates 10 and 20 are attached to each other.

FIG. 2A is a schematic plan view of the organic electroluminescent device according to the related art. In FIG. 2A, a gate line 37 crosses a data line 51 and a power line 42, with the data line 51 and the power line 42 being spaced apart from each other. A pixel region "P" is defined by the gate line 37, the data line 51 and the power line 42. A switching thin film transistor (TFT) "$T_S$" is located adjacent to the crossing of the gate line 37 and the data line 51. A driving TFT "$T_D$" is connected to the switching TFT "$T_S$" and the power line 42. A storage capacitor "$C_{ST}$" uses a portion of the power line 42 as a first capacitor electrode and an active pattern 34 extending from an active layer 31 of the switching TFT "$T_S$" as a second capacitor electrode. A first electrode 58 is connected to the driving TFT "$T_D$," and an organic electroluminescent (EL) layer (not shown) and a second electrode (not shown) are sequentially formed on the first electrode 58. The first and second electrodes and the organic EL layer interposed therebetween constitute an organic EL diode "$D_{EL}$."

FIG. 2B is a schematic cross-sectional view taken along the line "II—II" in FIG. 2A. In FIG. 2B, the driving thin film transistor (TFT) "$T_D$" including an active layer 32, a gate electrode 38 and source and drain electrodes 50 and 52 are formed on a substrate 10. The source electrode 50 is connected to the power line 42, and the drain electrode 52 is connected to the first electrode 58. An active pattern 34 made of the same material as the active layer 32 is formed under the power line 42 with an insulating layer 40 interposed therebetween. The active pattern 34 and the power line 42 constitute the storage capacitor "$C_{ST}$." An organic electroluminescent (EL) layer 64 and a second electrode layer 66 are sequentially formed on the first electrode 58, and constitute an organic EL diode "$D_{EL}$." A first insulating layer 30 is formed between the substrate 1 and the active layer 32. The first insulating layer 30 may serve as a buffer layer. A second insulating layer 36 is formed between the active layer 32 and the gate electrode 38. A third insulating layer 40 is formed between the active pattern 34 and the power line 42. A fourth insulating layer 44 is formed between the power line 42 and the source electrode 50. A fifth insulating layer 54 is formed between the drain electrode 52 and the first electrode 58. A sixth insulating layer 60 is formed between the first electrode 58 and the organic EL layer 64. The third to sixth insulating layers 40, 44, 54 and 60 include contact holes for electric connections.

In the organic ELD according to the related art, the array element layer having TFTs and the organic electroluminescent (EL) diode are formed on the first substrate, and the second substrate is attached to the first substrate for encapsulation. However, when the array element layer having TFTs and the organic EL diode are formed on one substrate in this way, production yield of the organic ELD is determined by a multiplication of the array element layer's yield and the organic EL diode's yield. Because the yield of the organic EL diode is relatively low, the production yield of the overall ELD becomes limited by the yield of the organic EL diode. For example, even when TFTs are well fabricated, an organic ELD using a thin film of about 1000 Å thickness can be determined to be defective due to a defect of an organic emission layer. This results in loss of materials and high production costs.

In the meanwhile, organic ELDs are classified into a bottom emission type and a top emission type according to an emission direction of light used for displaying images via the organic ELDs. The bottom emission type organic ELDs have such advantages as high encapsulation stability and high process flexibility. However, the bottom emission type organic ELDs are ineffective for high resolution devices because they have a low aperture ratio. In contrast, the top emission organic ELDs have a higher expected life span because they are more easily designed and have a high aperture ratio. However, in the top emission type organic ELDs, the cathode is generally formed on an organic emission layer. As a result, transmittance and optical efficiency of the top emission type organic ELDs are reduced because of a limited number of materials that can be selected. When a thin film passivation layer is formed to avoid the reduction of light transmittance, the thin film passivation layer may fail to block infiltration of exterior air into the device.

SUMMARY OF THE INVENTION

Accordingly, the present invention is directed to an organic electroluminescent device and a method of fabricating thereof that substantially obviate one or more of the problems due to limitations and disadvantages of the related art.

An advantage of the present invention is to provide an organic ELD having an improved production yield, a high resolution and a high aperture ratio. An organic ELD according to the present invention is a dual panel type such that an array element layer having TFTs and an organic EL diode are formed on their respective substrates.

Another advantage of the present invention is to provide a dual panel type organic ELD having an absorbent layer that has absorbing ability.

Additional features and advantages of the invention will be set forth in the description which follows and in part will be apparent from the description or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates facing each other and spaced apart from each other, each of the first and second substrates having a first region and a second region in a periphery of the first region; an array element on an inner surface of the first substrate, the array element having a thin film transistor; an organic electroluminescent diode on an inner surface of the second substrate in the first region; a connection electrode between the first and second substrates in the first region, the connection electrode connecting the first and second substrates electrically; a spacer on an inner surface of the first substrate in the second region, the spacer having a thickness corresponding to a height of the connection electrode; an absorbent layer on an inner surface of the second substrate in the second region; and a seal pattern attaching the first and second substrates, the seal pattern outside of the absorbent layer, wherein first laminate layers including the organic electroluminescent diode of the second substrate in the first region have a thickness substantially equal to a thickness of second laminate layers including the absorbent layer of the second substrate in the second region.

In another aspect, a method of fabricating an organic electroluminescent device, includes: forming an array element including a thin film transistor on a first substrate having a first region and a second region in a periphery of the first region; forming a spacer on the first substrate in the second region; forming an organic electroluminescent diode on a second substrate having the first region and the second region, the organic electroluminescent diode in the first region; forming an absorbent layer on the second substrate in the second region; forming a connection electrode on one of the first and second substrates; and connecting the first and second substrates electrically through the connection electrode, wherein first laminate layers including the organic electroluminescent diode of the second substrate in the first region have a thickness substantially equal to a thickness of second laminate layers including the absorbent layer of the second substrate in the second region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
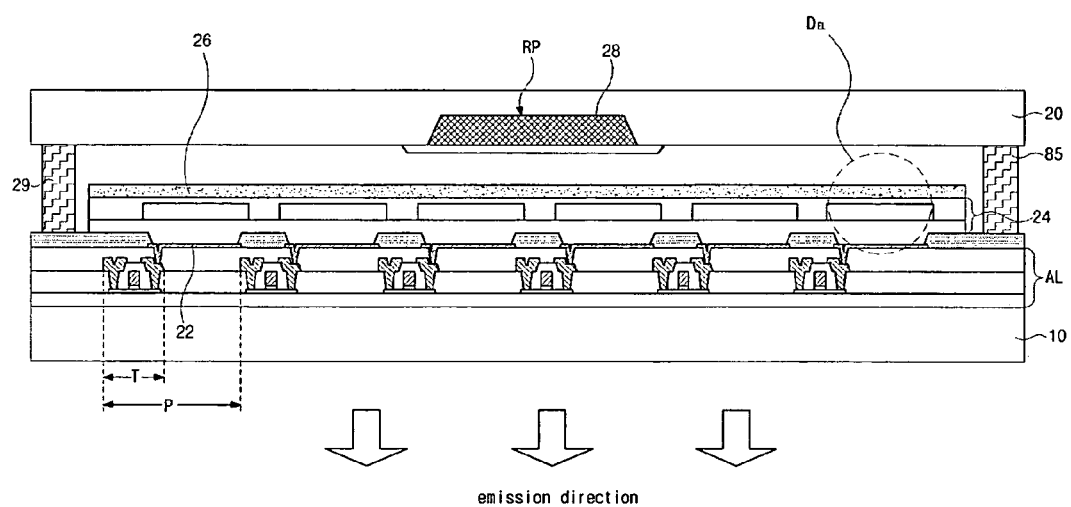
FIG. 1 is a schematic cross-sectional view of an organic ELD according to a related art.
Figure 2A:
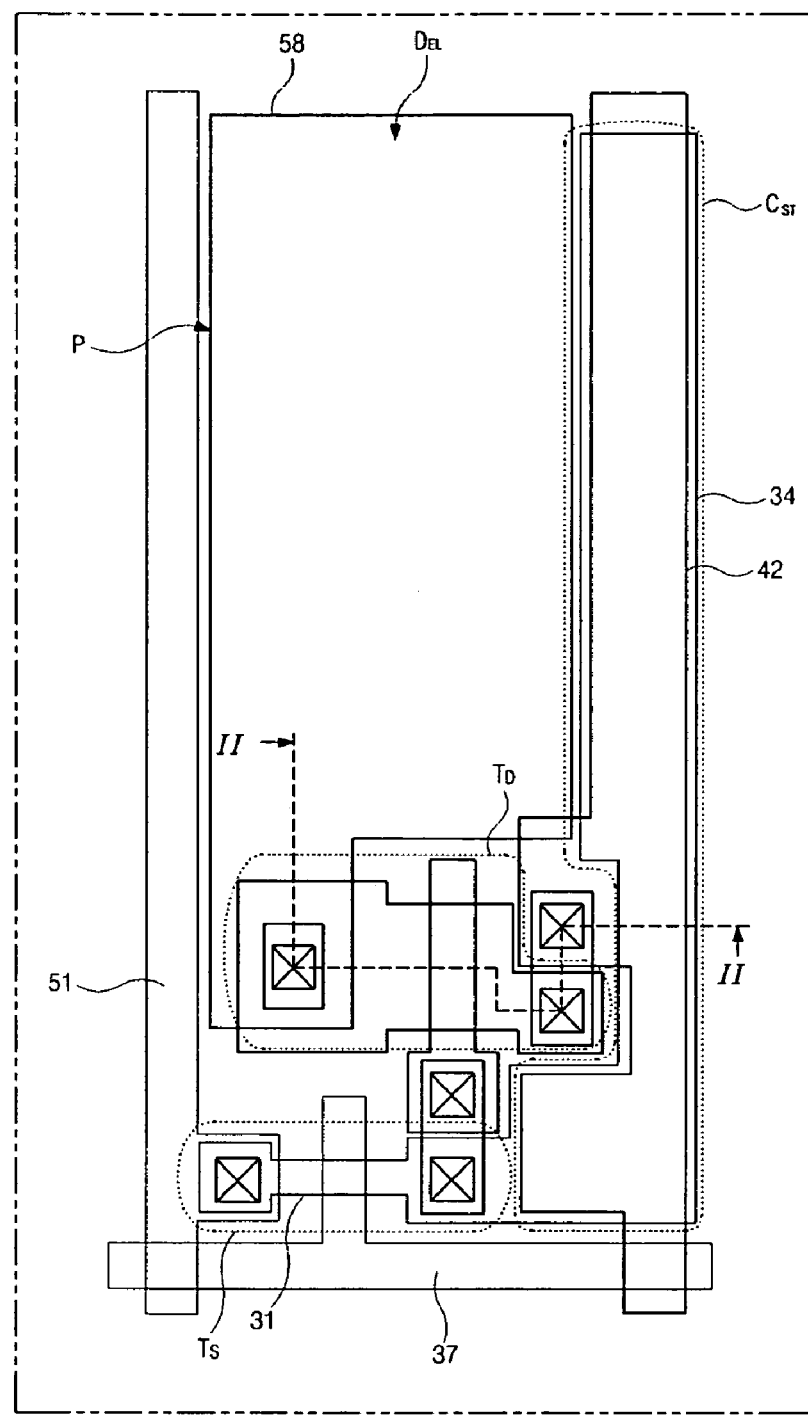
FIG. 2A is a schematic plan view of the organic electroluminescent device according to the related art in FIG. 1.
Figure 2B:
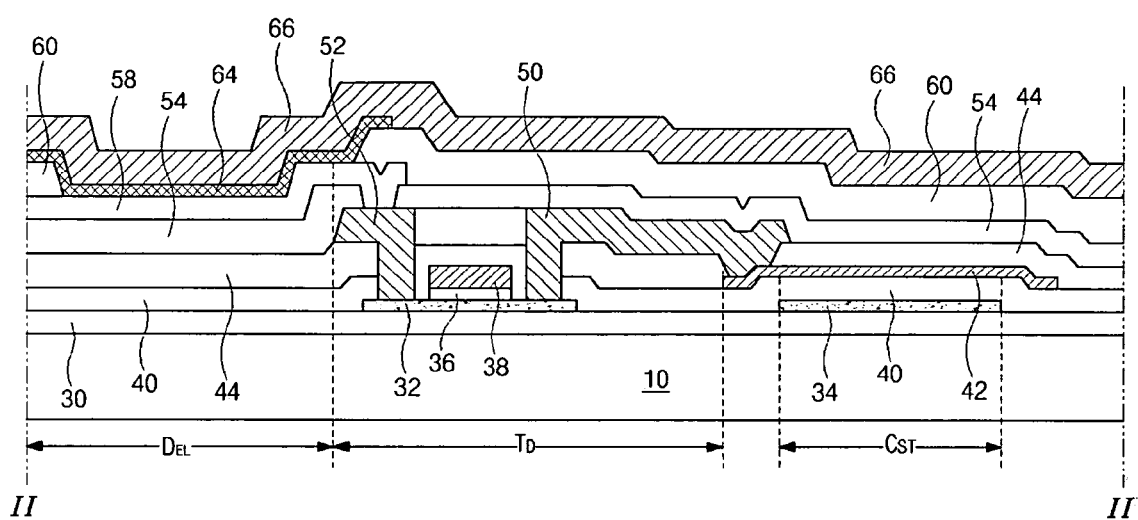
FIG. 2B is a schematic cross-sectional view taken along the line "II—II" in FIG. 2A.
Figure 3:
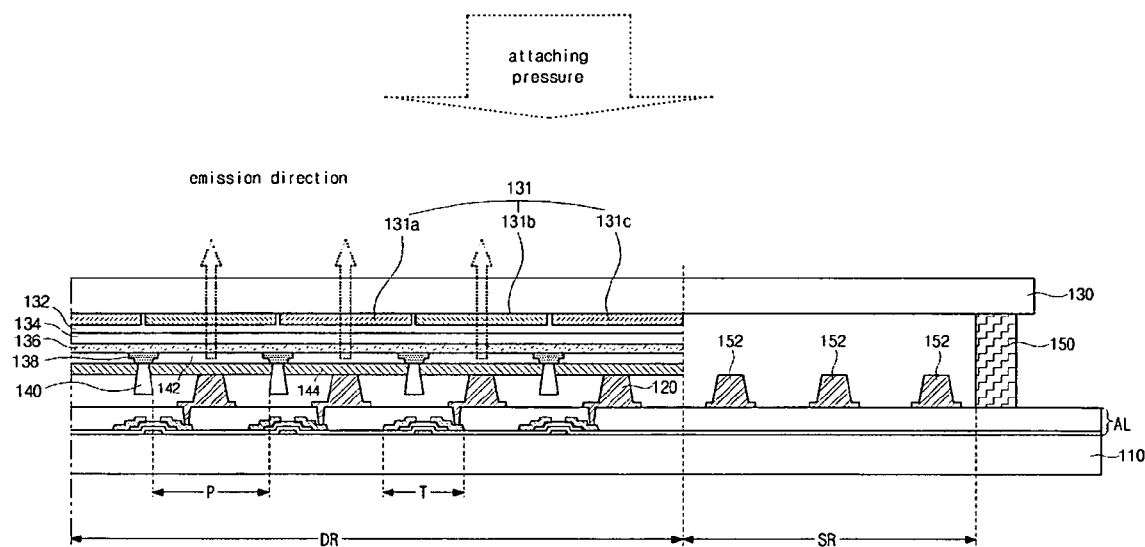
FIG. 3 is a schematic cross-sectional view of a dual panel type organic electroluminescent device according to a first embodiment of the present invention.

FIG. 3 is a schematic cross-sectional view of an organic electroluminescent (EL) device of a dual panel type according to a first embodiment of the present invention.

The dual panel type organic EL device in FIG. 3 includes a full-color element. The full-color element can be a single-layer color filter having red, green and blue color filters or a dual-layer color filter having a color filter layer and color-changing mediums. When the single-layer color filter is used as the full-color element for an organic EL device, an organic electroluminescent (EL) layer for the organic electroluminescent (EL) diode includes a single color emitting material (e.g., a white color emitting material). On the other hand, when the dual-layer color filter is used as the full-color element for an organic EL device, an organic EL layer for the organic EL diode includes a single color emitting material (e.g., a blue color emitting material such as a sky blue color material or a greenish blue color material). In FIG. 3, the dual panel type organic EL device includes a single-layer color filter as a full-color element.

Referring to FIG. 3, first and second substrates 110 and 130 face each other and are spaced apart from each other. A first region "DR" and a second region "SR" in a periphery of the first region "DR" are defined both in the first and second substrates 110 and 130. Specifically, the first region "DR" corresponds to a display region, and the second region "SR" corresponds to a side region in an attached region of the first and second substrates 110 and 130.

Still referring to FIG. 3, an array element layer "AL" having a plurality of thin film transistors (TFTs) "T" is formed on the first substrate 110. Although not shown in FIG. 3, the array element layer "AL" includes a plurality of gate lines in a first direction and a plurality of data lines crossing the plurality of gate lines in a second direction. In addition, a pixel region "P" is defined at a crossing of the gate and data lines, and the pixel region "P" is spaced apart from neighboring pixel regions. A plurality of connection electrodes 120 are formed on the array element layer "AL." In addition, the TFT "T" and the connection electrode 120 are connected in the pixel region "P." The TFT "T" includes a switching TFT (not shown) and a driving TFT (not shown) connected to the switching TFT, and the TFT "T" may be an amorphous-silicon TFT or a poly-silicon TFT. The TFT "T" connected to the connection electrode 120 is the driving TFT.

Meanwhile, a color filter layer 131, an overcoat layer 132 and a barrier layer 134 are sequentially formed on the second substrate 130, and a first electrode 136 is formed on an entire surface of the barrier layer 134. In addition, an interlayer 138 is formed on the first electrode 136 in a non-pixel region (not shown) at a boundary of the pixel regions "P", and a separator 140 is formed on the interlayer 138 in the non-pixel region. The separator 140 has a thickness corresponding to a gap between the first and second substrates 110 and 130. In addition, a plurality of organic EL layers 142 and a plurality of second electrodes 144 are sequentially formed on the first electrode 136 in the pixel region "P" surrounded by the separator 140. The organic EL layer 142 and the second electrode 144 are automatically patterned by the separator 140. The first electrode 136, the organic EL layer 142 and the second electrode 144 constitute an organic EL diode "$D_{EL}$." When the organic EL diode "$D_{EL}$" is a top emission type, the first electrode 136 may include a transparent conductive material. For example, when the first electrode 136 functions as an anode, and the second electrode 144 functions as a cathode, the first electrode 136 may be made of one of indium-tin-oxide (ITO), indium-zinc-oxide (IZO) and indium-tin-zinc-oxide (ITZO).

Meanwhile, the color filter layer 131 includes red, green and blue color filters 131a, 131b and 131c, each of which is located in each pixel region "P." Although not shown in FIG. 3, a black matrix (not shown) may be formed on the second substrate 130 in border portions of the red, green and blue color filters 131a, 131b and 131c. The overcoat layer 132 can level height differences between the red, green and blue color filters 131a, 131b and 131c and overlapped or spaced portion therebetween. Moreover, the barrier layer 134 can prevent outgassing from the color filter layer 131 and stabilize thin film patterns thereon, and the interlayer 138 can prevent shorting between the first and second electrodes 136 and 144. The first and second substrates 110 and 130 are attached to each other with a seal pattern 150 therebetween in an outermost edge.

Accordingly, the array element layer "AL" and the organic EL diode "$D_{EL}$" are formed on their respective substrates, thereby increasing product yield and efficiency. In addition, the overall design of the array layer including TFTs may be simplified. When the dual panel type organic ELD is a top emission type, it further has such advantages as a high aperture ratio, a high resolution and a long expected life span.

Meanwhile, the first region "DR" is defined as a region including the plurality of the pixel regions "P," and the second region "SR" is defined as a side region of the first region "DR." The second region "SR" is located between the first region "DR" and a portion of the seal pattern 150. A plurality of spacers 152 are formed between the first and second substrates 110 and 130 in the second region "SR." The spacers 152 are simultaneously formed with the connection electrodes 120 using the same material of the connection electrodes 120. Although not shown in FIG. 3, the spacers 152 are formed in a surrounding portion to prevent a panel sagging of the first and/or second substrates 110 and/or 130.

Figure 4:
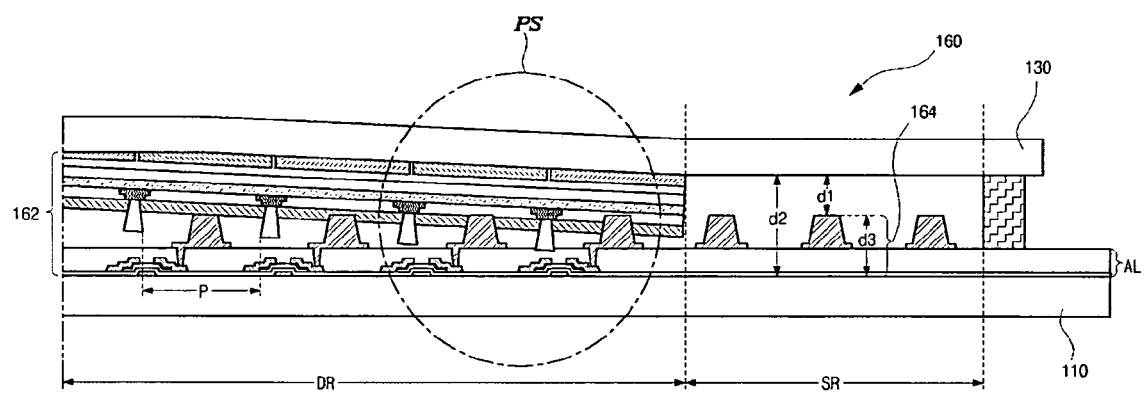
FIG. 4 is a schematic cross-sectional view illustrating a panel sagging problem.

FIG. 4 is a schematic cross-sectional view illustrating a panel sagging problem. Referring to FIG. 4, a dual panel type organic ELD 160 has first laminated layers 162 in a first region "DR," and second laminated layers 164 in a second region "SR." After first and second substrates 110 and 130 are attached to each other, the first and second laminate layers 162 and 164 have a thickness difference "d1." Because a portion of the second substrate 130 in the second region "SR" does not include any laminate layer, a thickness "d2" of the first laminated layers 162 is greater than a thickness "d3" of the second laminated layers 164. As a result, a panel sagging problem may occur in a portion "PS," and pixel regions "P" adjacent to the second region "SR" may be affected by the panel sagging problem. If the first and second substrates 110 and 130 are pressed under a much stronger pressure than a normal pressure and are misaligned during the attachment process, the panel sagging problem may exacerbate. Furthermore, because the organic ELD 160 including a full-color element needs the overcoat layer 132 (of FIG. 3) and the barrier layer 134 (of FIG. 3) between the second substrate 130 and organic EL diode "$D_{EL}$" (of FIG. 3), which means, the overcoat layer 132 (of FIG. 3) and the barrier layer 134 (of FIG. 3) should have enough thickness to perform their functions, the panel sagging problem due to the thickness difference "d1" between the first and second region "DR" and "SR" further exacerbates.

In addition, the dual panel type organic ELD 160 may not have enough additional space to include an absorbent as compared with the organic ELD of the related art. Because the organic ELD according to the related art does not include any thin film pattern on the second substrate that functions as an encapsulating panel, it has enough space to include an absorbent on an inner surface of the second substrate, thereby having an absorbing ability. However, because the first and second substrates according to the first embodiment shown in FIG. 4 have the array element layer and the organic EL diode, respectively, there is not enough space for an absorbent.

Hereinafter, a dual panel type organic ELD having an absorbent layer according to a second embodiment of the present invention will be described, which is able to overcome the disadvantages explained above. An absorbent layer is located in a side region and has a buffer function to minimize the panel sagging problem.

Figure 5:
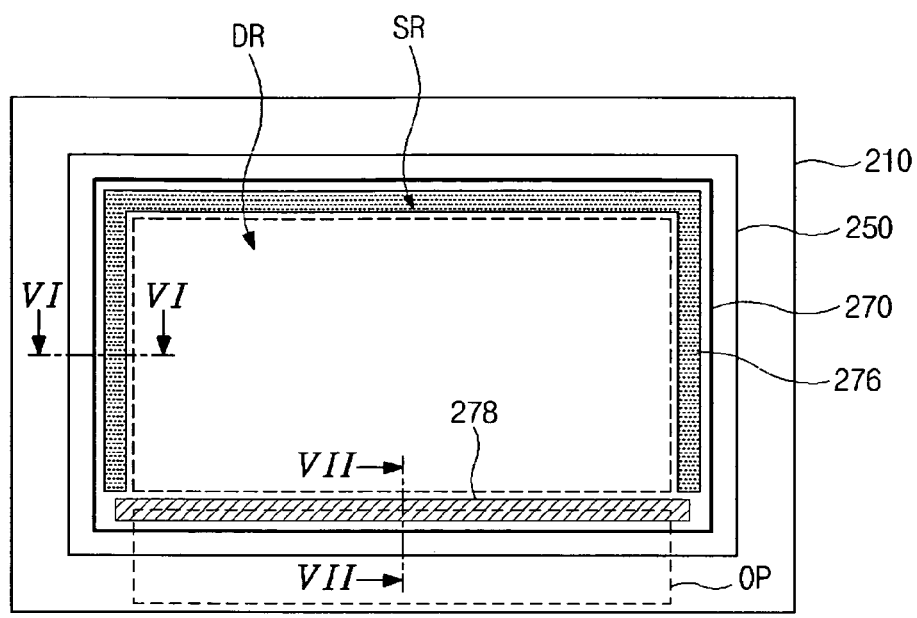
FIG. 5 is a schematic plan view of a dual panel type organic electroluminescent device according to a second embodiment of the present invention.
Figure 6:
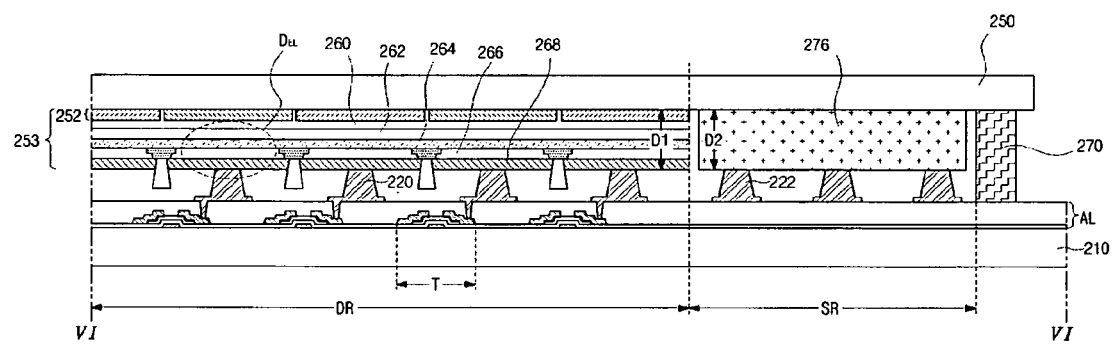
FIGS. 6 and 7 are schematic cross-sectional views taken along the lines "VI—VI" and "VII—VII" in FIG. 5, respectively.
Figure 7:
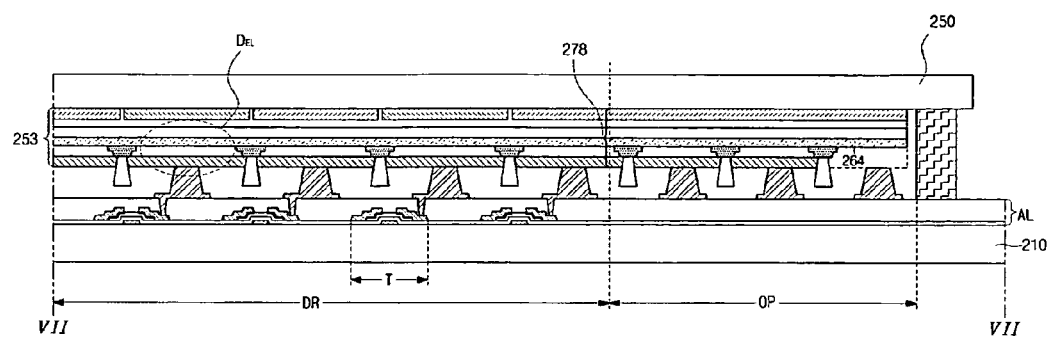

FIG. 5 is a schematic plan view showing a dual panel type organic ELD according to the second embodiment of the present invention, FIGS. 6 and 7 are schematic cross-sectional views taken along the lines "VI—VI" and "VII—VII" of FIG. 5, respectively.

Referring to FIG. 5, first and second substrates 210 and 250 face each other and are spaced apart from each other. The first and second substrates 210 and 250 are attached to each other with a seal pattern 270 therebetween in an outermost edge. A first region "DR", a second region "SR" in a periphery of the first region "DR" are defined both in the first and second substrates 210 and 250. Although not shown in FIG. 5, an organic EL diode "$D_{EL}$" is formed on an inner surface of the second substrate 250, which includes first and second electrodes and an organic EL layer between the first and second electrodes. When the first electrode is formed on an entire surface of the second substrate, the first electrode may function as a common electrode connected to an outer IC (not shown), and the second region "SR" of the second substrate 250 includes an connection portion "OP" of the outer IC. In addition, an absorbent layer 276 is formed on the second substrate 250. The absorbent layer 276 surrounds the second region "SR" except the outer IC connection portion "OP," to improve absorbing ability. This is because absorbing ability is in proportion to a size of the absorbent layer 276. The absorbent layer 276 may be formed of a single layer or multiple layers with a plurality of thin film patterns, and it may be made in substantially any manner desired. The absorbent layer 276 has an absorbing ability. Thus, it eliminates moisture inside the panel and prevents the panel sagging problem resulting from a thickness difference between the first and second region "DR" and "SR." The absorbent layer 276 may be formed of a non-solvent type absorbent material.

Meanwhile, a dummy layer 278 is formed on the second substrate 250 in the outer IC connection portion "OP" of the second region "SR." Although not shown in FIG. 5, the dummy layer 278 may extend to the laminated layers (not shown) of the second substrate 250 in the first region "DR." As shown in FIG. 5, the absorbent layer 276 and the dummy layer 278 are formed on the second substrate 250 in the second region "SR," but they are located independently.

Hereinafter, a specific cross-sectional structure of the dual panel type organic ELD according to the second embodiment of the present invention will be set forth.

Referring to FIG. 6, the first and second substrates 210 and 250 face each other and are spaced apart from each other. The first and second substrates 210 and 250 are attached to each other with a seal pattern 270 therebetween in an outermost edge. The first region "DR" and the second region "SR" shown in FIG. 5 are defined both in the first and second substrates 210 and 250. An array element layer "AL" having a plurality of TFTs "T" is formed on an inner surface of the first substrate 210, and a plurality of connection electrodes 220 are formed on the array element layer "AL." The TFT "T" include a switching TFT (not shown) and a driving TFT (not shown), although not shown in FIG. 6, the connection electrode 220 is connected to the driving TFT. In addition, the TFT "T" can be an amorphous-silicon TFT or a poly-silicon TFT in substantially any manner desired. In addition, a plurality of spacers 222 are formed on the first substrate 210 in the second region "SR." The spacer has a thickness corresponding to a height of the connection electrode 220.

A color filter layer 252 is formed on an inner surface of the second substrate 250 in the first region "DR," and a plurality of organic EL diodes "$D_{EL}$" are formed on the color filter layer 252. The organic EL diode "$D_{EL}$" includes first and second electrodes 264 and 268 and an organic EL layer 266 therebetween. An overcoat layer 260 and a barrier layer 262 are sequentially formed between the color filter layer 252 and the first electrode 264. Furthermore, an absorbent layer 276 is formed on an inner surface of the second substrate 250 in the second region "SR." Accordingly, all the layers from the color filter layer 252 to the second electrode 268 constitute a first laminated layers 253.

The absorbent layer 276 according to the second embodiment of the present invention has a thickness corresponding to a thickness "D1" of the first laminate layers 253. In other words, the thickness "D1" of the first laminate layers 253 is substantially equal to a thickness "D2" of the absorbent layer 276. For example, a thickness difference between the thicknesses "D1" and "D2" can be less than 500 nm. Thus, the absorbent layer 276 can function as an absorbent inside the panel and as a buffer capable of minimizing a thickness difference between the first and second regions "DR" and "SR." In addition, the dummy layer 278 (of FIG. 5) in the outer IC connection portion "OP" is desired to control a whole thickness of the organic ELD panel.

Referring to FIG. 7, the first laminated layers 253 shown in FIG. 6 are formed on an inner surface of the second substrate 250 in the first region "DR," and the dummy layer 278 is formed on an inner surface of the second substrate 250 in the second region "SR." The dummy layer 278 is formed using the same material as the first laminated layers 253, and thus a thickness of the dummy layer 278 is substantially equal to the thickness "D1" shown in FIG. 6. In FIG. 7, the outer IC connection portion "OP" shown in FIG. 5 is located in the second region "SR" (of FIG. 5). Although not shown in FIG. 7, the first electrode 264 (of FIG. 6) contacts an outer IC (not shown) in the outer IC connection portion "OP." In addition, a main element of the array element layer "AL" (as shown in FIG. 6) is formed in the first region "DR," and a side element of the array element layer "AL" such as a pad connected to the outer IC (not shown) is formed in the second region "SR" (of FIG. 5).

Hereafter, another laminated structure in a second region "SR" according to the second embodiment of the present invention will be explained.

Figure 8:
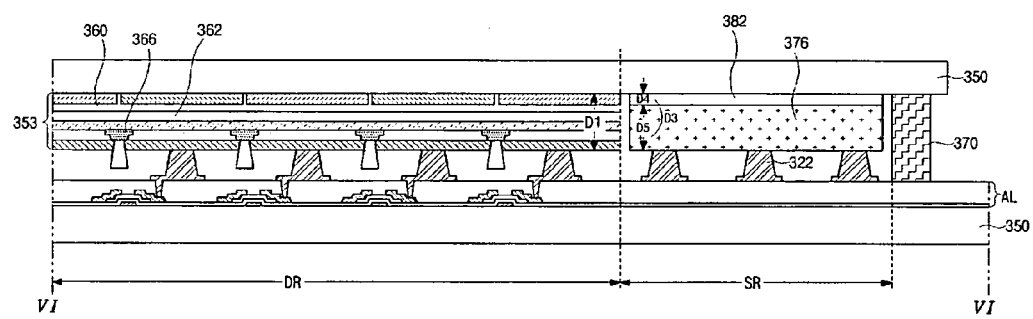
FIG. 8 is a schematic cross-sectional view taken along the line "VI—VI" in FIG. 5 according to a modified second embodiment of the present invention.

FIG. 8 is a schematic cross-sectional view taken along the line "VI—VI" of FIG. 5 according to a modified second embodiment of the present invention. Because FIG. 8 shows a modified laminated structure in a second region "SR," only characteristic parts will be explained, compared with FIG. 6. Referring to FIG. 8, a buffer layer 382 and an absorbent layer 376 are sequentially formed on a second substrate 350 in a second region "SR." A thickness "D3" is substantially equal to a thickness "D1." For example, a thickness difference between the thicknesses "D1" and "D3" can be less than 500 nm as in the same relationship between the thicknesses "D1" and "D2" of FIG. 6. Although not shown in FIG. 8, the absorbent layer 376 is not located in the outer IC connection portion "OP" (of FIG. 7).

Still referring to FIG. 8, the buffer layer 382 and the absorbent layer 376 are spaced apart from a first laminate layers 353. However, when the absorbent layer 376 includes a non-conductive material, it may contact the first laminated layers 353. Therefore, the absorbent layer 376 may be manufactured easier than the absorbent layer 276 shown in FIG. 6. In addition, the buffer layer 382 is formed of at least one of the materials of the first laminate layers 353. The absorbent layer 376 may be formed of the same material as an overcoat layer 360, a barrier layer 362 or a interlayer 366, which may be selected from a transparent material.

A dual panel organic ELD according to the present invention may include an independent emission type organic EL layer, which includes red, green and blue emission layers, without an overcoat layer, a barrier layer and a full color element. For a dual panel organic ELD having a full-color element, a thickness difference between the display region and the periphery region of the display region is greater than a thickness difference of an independent emission type. Thus, a structure having an absorbent layer or a structure having a buffer layer and an absorbent layer is more effective for a dual panel organic ELD having a full-color element.

Figure 9:
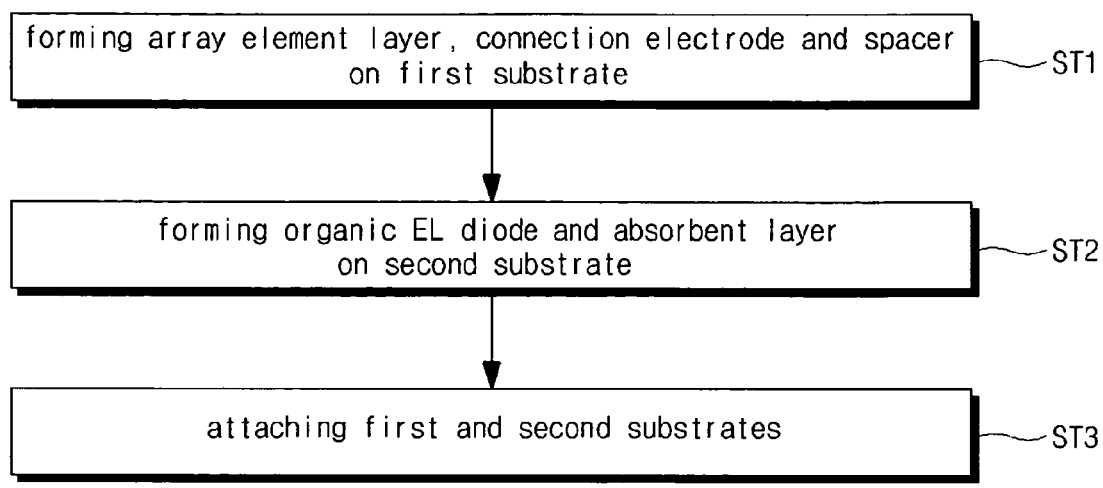
FIG. 9 is a flow chart of a fabricating process of a dual type organic ELD of FIGS. 6 and 7 according to the second embodiment of the present invention.

FIG. 9 is a flow chart of a fabricating process of the dual type organic ELD of FIGS. 6 and 7 according to the second embodiment of the present invention. Referring to FIG. 9, the first region "DR" and the second region "SR" shown in FIG. 6 are defined in the first and second substrates 210 and 250.

In step ST1, the array element layer "AL" having a plurality of TFTs "T" is formed on the first substrate 210, and the plurality of connection electrodes 220 are formed on the array element layer "AL." The connection electrode 220 is connected to the TFT "T" in the first region "DR" shown in FIG. 6. In addition, the plurality of spacers 222 are formed on the first substrate 210 in the second region "SR." The connection electrode 220 has a thickness equal to a thickness of the spacer 222, because they are formed by the same process and material shown in FIG. 6.

In step ST2, the color filter layer 252 is formed on the second substrate 250 in the first region "DR," and the plurality of organic EL diodes "$D_{EL}$" are formed on the color filter layers 252 in the first region "DR." The overcoat layer 260 and the barrier layer 262 are further formed between the color filter layer 252 and the organic EL diode "$D_{EL}$" sequentially shown in FIG. 6. Each of the organic EL diode "$D_{EL}$" includes the first electrode 264, the organic EL layer 266 and second electrode 268. In addition, the absorbent layer 276 is formed on the second substrate 250 in the second region "SR" which surrounds the second region "SR" except the outer IC connection portion "OP" shown in FIGS. 5 and 6. Furthermore, the dummy layer 278 is formed on the second substrate 250 in the outer IC connection portion "OP" of the second region "SR," and includes the same materials as the color filter layer 252, the overcoat layer 260, the barrier layer 262, the first electrode 264, the organic EL layer 266 and the second electrode 268, to have the same thickness as the first laminated layers 253 shown in FIG. 6.

The order of the steps ST1 and ST2 can be changed, or simultaneously performed in substantially any manner desired.

In step ST3, the seal pattern 270 is formed on one of the first and second substrates 210 and 250 in a surrounding portion of an outermost edge. The seal pattern 270 is located in an outside of the second region "SR." And then, the first and second substrates 210 and 250 are attached to each other with the seal pattern 270 therebetween, as shown in FIG. 6. Because the first laminate layers 253 in the first region "DR" have a thickness substantially equal to a thickness of the absorbent layer 276 in the second region "SR" as shown in FIG. 6, the panel sagging problem is minimized during the attachment process. Furthermore, because the absorbent layer 276 is also used for a preventing means of the panel sagging problem, an organic ELD according to the present invention can have an absorbing ability without an additional packaging process for an absorbent material.

After the attachment step, a step of irradiating a ultraviolet (UV) light may proceed to harden the absorbent layer (e.g., in the back side of the second substrate). In this case, a buffer layer of a transparent material may be formed on the second substrate with the absorbent layer. As shown in FIG. 8, the buffer layer 382 may be formed between the second substrate 350 and the absorbent layer 376 in the second region "SR" except the outer IC connection portion "OP" (of FIG. 5). In this case, the thickness "D3" of the buffer layer 382 and the absorbent layer 376 corresponds to the thickness "D1" of the first laminate layers 353 in the first region "DR" of the second substrate 350, as shown in FIG. 8.

Accordingly, a dual panel type organic ELD and a method of fabricating thereof according to an embodiment of the present invention result in several advantages. First, because a dual panel type organic ELD according to an embodiment of the present invention may be a top emission type, a high aperture ratio can be obtained. Second, because an array element layer including thin film transistors and an organic EL diode are independently formed on their respective substrates, disadvantages due to fabrication conditions of organic EL diodes can be minimized, thereby improving the overall production yield. Third, an absorbent layer having an absorbing ability is formed in a periphery of the display region without additional thin film patterns, which provides an absorbing ability inside the panel and prevents the panel sagging problem. Therefore, a space for an absorbent is not necessary. Fourth, because the periphery region of the second substrate may have a single layer structure with the absorbent layer, or a multi-layer structure with the buffer layer and the absorbent layer, degree of process freedom for the absorbent layer increases.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   first and second substrates facing each other and spaced apart from each other, each of the first and second substrates having a first region and a second region in a periphery of the first region;
   an array element on an inner surface of the first substrate, the array element having a thin film transistor;
   an organic electroluminescent diode on an inner surface of the second substrate in the first region;
   a connection electrode between the first and second substrates in the first region, the connection electrode connecting the first and second substrates electrically;
   a spacer on an inner surface of the first substrate in the second region, the spacer having a thickness corresponding to a height of the connection electrode;
   an absorbent layer on an inner surface of the second substrate in the second region; and
   a seal pattern attaching the first and second substrates, the seal pattern outside of the absorbent layer,
   wherein first laminate layers including the organic electroluminescent diode of the second substrate in the first region have a thickness substantially equal to a thickness of second laminate layers including the absorbent layer of the second substrate in the second region.

2. The device according to claim 1, wherein the second laminate layers include a buffer layer between the second substrate and the absorbent layer in the second region.

3. The device according to claim 1, wherein the absorbent layer includes a non-solvent type absorbent material.

4. The device according to claim 1, wherein the second region includes first to fourth regions, the first to third regions include the absorbent layer, and the fourth region does not include the absorbent layer.

5. The device according to claim 4, further comprising a dummy layer on the fourth region, and the dummy layer extends to the second laminate layers, the dummy layer having a thickness substantially equal to the thickness of the second laminate layers.

6. The device according to claim 4, wherein the fourth region includes an outer IC connection portion.

7. The device according to claim 2, wherein the organic electroluminescent diode includes a first electrode on the second substrate, an organic electroluminescent layer on the first electrode, and a second electrode on the organic electroluminescent layer.

8. The device according to claim 7, wherein the first region includes a plurality of pixel regions in a matrix configuration, and the second electrode is formed in each pixel region.

9. The device according to claim 8, wherein the organic electroluminescent layer includes red, green and blue organic electroluminescent layers, and each of the red, green and blue organic electroluminescent layers corresponds to each of the plurality of the pixel regions.

10. The device according to claim 9, further comprising a color filter layer between the second substrate and the first electrode.

11. The device according to claim 10, wherein the buffer layer includes at least one of the same material as the color filter layer, the first electrode, the organic electroluminescent layer and the second electrode.

12. The device according to claim 10, wherein the organic electroluminescent layer has a single color.

13. The device according to claim 10, further comprising an overcoat layer between the color filter layer and the first electrode, and a barrier layer on the overcoat layer.

14. The device according to claim 12, wherein the buffer layer includes at least one of the same material as the color filter layer, the overcoat layer, the barrier layer and the organic electroluminescent diode.

15. The device according to claim 5, wherein the organic electroluminescent diode includes a first electrode on the second substrate, an organic electroluminescent layer on the first electrode, and a second electrode on the organic electroluminescent layer.

16. The device according to claim 15, wherein the dummy layer includes the same material as the first electrode, the organic electroluminescent layer and second electrode.

17. The device according to claim 15, further comprising a color filter layer between the second. substrate and the first electrode.

18. The device according to claim 17, wherein the dummy layer includes the same material as the color filter, the first electrode, the organic electroluminescent layer and the second electrode.

19. The device according to claim 17, further comprising an overcoat layer between the color filter layer and the first electrode, and a barrier layer on the overcoat layer.

20. The device according to claim 17, wherein the dummy layer includes the same material as the color filter, the overcoat layer, the barrier layer, the first electrode, the organic electroluminescent layer and second electrode.

21. The device according to claim 7, further comprising a color filter layer, a color changing element, an overcoat layer and a barrier layer between the second substrate and the organic electroluminescent diode.

22. The device according to claim 21, wherein the buffer layer includes at least one of the same material as the color filter layer, the color changing element, the first electrode, the organic electroluminescent layer and the second electrode.

23. The device according to claim 15, further comprising a color filter layer, a color changing element, an overcoat layer and a barrier layer between the second substrate and the organic electroluminescent diode.

24. The device according to claim 15, wherein the dummy layer includes the same material as the color filter, the color changing element, the first electrode, the organic electroluminescent layer and the second electrode.

25. The device according to claim 2, wherein the buffer layer includes a transparent conductive material.

26. The device according to claim 7, wherein the first electrode functions as an anode.

27. The device according to claim 19, wherein the first electrode includes a transparent conductive material.

28. The device according to claim 7, wherein the second electrode functions as a cathode.

* * * * *